(12) United States Patent
Kwong et al.

(10) Patent No.: US 8,611,095 B2
(45) Date of Patent: Dec. 17, 2013

(54) INTEGRATION OF SENSORS AND OTHER ELECTRONIC COMPONENTS

(75) Inventors: Kelvin Kwong, Cupertino, CA (US); Richard Hung Minh Dinh, San Jose, CA (US); Daniel William Jarvis, Sunnyvale, CA (US); Brian Richards Land, Woodside, CA (US); Anant Rai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/239,821

(22) Filed: Sep. 22, 2011

(65) Prior Publication Data

US 2013/0053106 A1   Feb. 28, 2013

Related U.S. Application Data

(60) Provisional application No. 61/529,824, filed on Aug. 31, 2011.

(51) Int. Cl.
*H05K 1/00* (2006.01)

(52) U.S. Cl.
USPC ............ 361/749; 361/752; 361/814; 174/254

(58) Field of Classification Search
USPC ........... 361/752–753, 749–750, 814; 174/254
See application file for complete search history.

(56) References Cited

U.S. PATENT DOCUMENTS

| | | | | |
|---|---|---|---|---|
| 4,227,788 A * | 10/1980 | Shimizu et al. | | 396/542 |
| 5,093,985 A | 3/1992 | Houldsworth et al. | | |
| 5,181,065 A * | 1/1993 | Hara | | 396/542 |
| 6,958,531 B2 | 10/2005 | Ucok et al. | | |
| 7,156,562 B2 | 1/2007 | Mazotti et al. | | |
| 7,660,127 B2 * | 2/2010 | Weber et al. | | 361/752 |
| 2004/0021792 A1 * | 2/2004 | Yasui | | 348/373 |
| 2007/0052044 A1 * | 3/2007 | Forsblad et al. | | 257/414 |
| 2008/0036473 A1 * | 2/2008 | Jansson | | 324/678 |
| 2009/0058687 A1 * | 3/2009 | Rothkopf et al. | | 341/20 |
| 2010/0157548 A1 * | 6/2010 | Wang et al. | | 361/749 |

OTHER PUBLICATIONS

Anonymous, "SW-Box—iPhone 5 Proximity Light Sensor Flex Cable," www.sw-box.com/Iphone-5-Proximity-Light-Sensor-Flex-Bable.html, Aug. 18, 2011.

* cited by examiner

*Primary Examiner* — Tuan Dinh
(74) *Attorney, Agent, or Firm* — Womble Carlyle Sandridge & Rice LLP (57) ABSTRACT

A proximity sensor for use in a portable computing device is described. In particular various embodiments of a proximity sensor which fit in an extremely small portion of a cellular phone, and accurately determine the presence of a user's head in close proximity to a surface of the cellular phone.

19 Claims, 9 Drawing Sheets

INTEGRATION OF SENSORS AND OTHER ELECTRONIC COMPONENTS

This application claims priority to and the benefit under 35 U.S.C. §119(e) of U.S. Provisional Application Ser. No. 61/529,824, filed Aug. 31, 2011, entitled PROXIMITY SENSOR by Kwong, the entire disclosure of which is hereby incorporated herein by reference.

FIELD OF THE DESCRIBED EMBODIMENTS

The described embodiments relate generally to the design of a proximity sensor. In particular a compact, reliable proximity sensor for use in a portable communication device such as a smart phone or tablet device is disclosed.

RELATED ART

Proximity sensors emit either electromagnetic fields or beams to detect objects. Depending on the proximity sensor target, different sensors may be used, for plastic objects, a capacitive or photoelectric sensor may meet performance requirements. For metal objects, an inductive sensor may better suit performance requirements. Proximity sensors have a large variety of uses and can be optimized for different objects. For example, the cellular phone industry uses proximity sensors to detect the presence of user's head. When object is within a specified distance, proximity sensor sends feedback to phone circuitry to disable the touch screen of a cell phone during a phone call. By disabling touch screen, the product battery life is saved and inadvertent screen touches can be prevented during a phone call. Most proximity sensors built in to cellular phones include an infrared light emitter and an infrared light detector. The infrared light emitter transmits light out from a surface of the cellular phone, and when the cellular phone gets close enough to a user's head the infrared light is reflected back into the infrared light detector which is also located below the surface of the cellular phone. Once the amount of reflected infrared light exceeds a certain threshold the proximity sensor sends response to circuitry to adjust the touch screen by, for example, disabling display and user input functions. There are a number of problems that can cause a proximity sensor to take inaccurate readings. For example, infrared light reflecting off the outer surface due to oil smears/smudge left on by the user. Furthermore, due to the overall reduction in size of most portable devices and the fact that proximity sensors also take up valuable space inside cellular phones, a sensor with a compact footprint is highly desirable.

Therefore what is desired is method and apparatus for providing a compact and accurate proximity sensor in a small form factor portable device.

SUMMARY OF THE DESCRIBED EMBODIMENTS

A flex connector assembly for connecting electrical components in a small form factor communication device is described. In one embodiment, the flex connector assembly includes at least a main body portion. The main body portion includes a first body portion having a first connection area arranged to receive and electrically connect to a first component, a second body portion having a second connection area arranged to receive and electrically connect to a second component, and a folding flexible portion connecting the first body portion and the second body portion. During an assembly operation and subsequent to the securing of the first component to the first body portion and the second component to the second body portion, the secured first component and the secured second component are brought in close proximity to each other by folding the folding flexible portion into a compact folded arrangement.

In one aspect of the described embodiment, the compact folded arrangement provides that the first component and the second component are placed in close proximity to each other and that the first component is recessed with respect to the second.

A portable computing device is described. The portable computing device includes at least a housing having an opening, a display assembly having a size and shape in accordance with the display assembly, a protective layer disposing within the opening, the protective layer having an exterior surface and an interior surface, a proximity sensor for detecting a presence of an object within a first distance of the exterior surface of the protective layer, an audio circuit for providing audible sound, and a flex connector assembly for connecting the proximity sensor and the audio circuit. In the described embodiment, the flex connector assembly includes at least a main body portion that includes a first body portion having a first connection area arranged to receive and electrically connect to the audio circuit, a second body portion having a second connection area arranged to receive and electrically connect to the proximity sensor, and a folding flexible portion connecting the first body portion and the second body portion. During an assembly operation of the portable computing device and subsequent to the securing of the audio circuit to the first body portion and the proximity sensor to the second body portion, the secured audio circuit and the secured proximity sensor are brought in close proximity to each other by folding the folding flexible portion into a compact folded arrangement.

A method of assembly of a small form factor communication device is described. In one embodiment, the method is carried out by providing a flex connector assembly for connecting electrical components in the small form factor communication device having housing. The flex connector assembly includes a main body portion having a first body portion having a first connection area electrically connected to a first component, a second body portion having a second connection area electrically connected to a second component, and a folding flexible portion connecting the first body portion and the second body portion. The flex connector assembly is placed in the housing and the first and second components are brought in close proximity to each other in the housing by folding the folding flexible portion into a compact folded arrangement. In this way, the compact folded arrangement of the flex connector assembly provides that the first component and the second component are placed in close proximity to each other and that the proximity sensor is recessed with respect to the audio circuit.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF EMBODIMENTS

Representative applications of methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figures 1, 2:
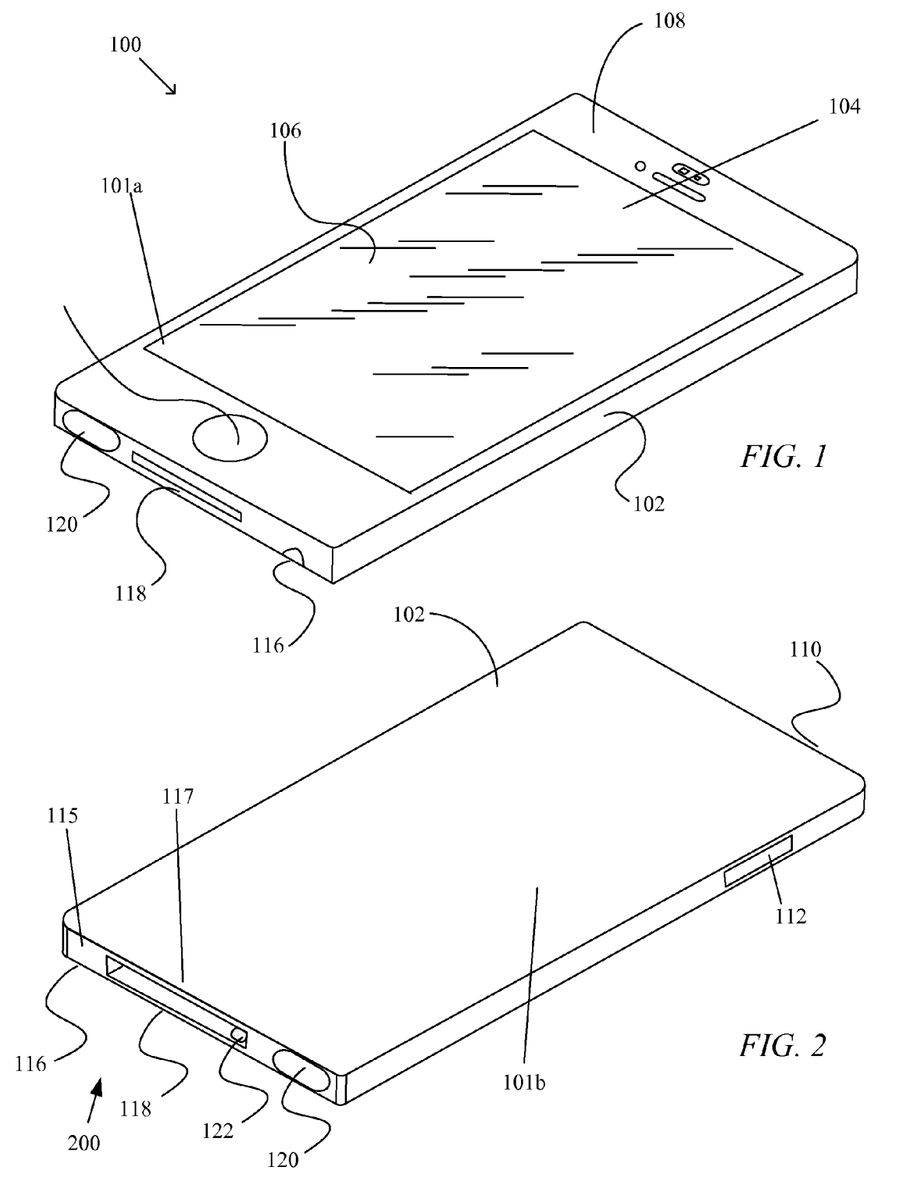
FIGS. 1 and 2 are perspective diagrams showing various views of a fully assembled cellular phone in accordance with an embodiment of the invention.

Prior to focusing on the proximity sensor, a general description of a portable device, its functions, and associated components are described to illustrate factors that affect packaging and housing design associated with device 100. FIGS. 1 and 2 are perspective diagrams showing various views of portable device 100. In the embodiments described herein, portable device 100 can take the form of smart phone 100. Smart phone 100 can be widely varied. In some embodiments, smart phone 100 can perform multiple functions (e.g., a device that plays/stores media, receives/transmits telephone calls/text messages/internet, and/or performs web browsing). Smart phone 100 is capable of communicating wirelessly (with or without the aid of a wireless enabling accessory system) and/or via wired pathways (e.g., using traditional electrical wires). In some embodiments, smart phone 100 can be extremely portable (e.g., small form factor, thin, lightweight). Smart phone 100 can be sized for one-handed operation and placement into small areas such as a pocket, i.e., smart phone 100 can be a handheld pocket sized electronic device. Smart phone 100 can correspond to an electronic device, such as an iPhone™ available by Apple Inc. of Cupertino, Calif.

Smart phone 100 includes a top face 101a and a bottom face 101b and connected by four sides. In one embodiment (not shown), the four sides can be angled or sloped inwards such that a surface area of the top face 101a is greater than a surface area of the bottom face 101b. Smart phone 100 can include housing 102 configured to at least partially enclose any suitable number of components associated with smart phone 100. For example, housing 102 can enclose and support internally various electrical components (including integrated circuit chips and other circuitry) to provide computing operations for the device. The integrated circuit chips and other circuitry can include a microprocessor, memory, a battery, a circuit board, I/O, various input/output (I/O) support circuitry and the like. Although not shown in this figure, housing 102 can define a cavity within which the components can be positioned and housing 102 also can physically support any suitable number of mechanisms, within housing 102 or within openings through the surface of housing 102.

In addition to the above, housing 102 can also define at least in part the outward appearance of smart phone 100. That is, the shape and form of housing 102 can help define the overall shape and form of smart phone 100 or the contour of housing 102 can embody the outward physical appearance of smart phone 100. Any suitable shape can be used. In some embodiments, the size and shape of housing 102 can be dimensioned to fit comfortably within a user's hand. In some embodiments, the shape includes a slightly curved back surface and highly curved side surfaces. Housing 102 is integrally formed in such a way as to constitute is a single complete unit. By being integrally formed, housing 102 has a seamless appearance unlike conventional housings that include two parts that are fastened together thereby forming a reveal, a seam there between. That is, unlike conventional housings, housing 102 does not include any breaks thereby making it stronger and more aesthetically pleasing. Housing 102 can be formed of any number of materials including for example plastics, metals, ceramics and the like. In one embodiment, housing 102 can be formed of stainless steel in order to provide an aesthetic and appealing look and feel as well as provide structural integrity and support for all subassemblies installed therein. When metal, housing 102 can be formed using conventional collapsible core metal forming techniques well known to those skilled in the art.

Display assembly 104 occupies a significant portion of an area of the top face. Along portions of the long sides of the top face 101a, edges of the display 104 are close to edges of the top face 101a where the thickness of the device 100 is decreasing. Smart phone 100 also includes cover 106 that includes a planar outer surface. The outer surface can for example be flush with an edge of the housing wall that surrounds the edge of the cover. Cover 106 cooperates with housing 102 to enclose smart phone 100. Although cover 106 can be situated in a variety of ways relative to the housing, in the illustrated embodiment, cover 106 is disposed within and proximate the mouth of the cavity of housing 102. That is, cover 106 fits into an opening 108. In an alternate embodiment, cover 106 can be opaque and can include touch sensing mechanism that forms a touch pad. Cover 106 can be configured to define/carry the user interface of smart phone 100. Cover 106 can provide a viewing region for display assembly 104 used to display a graphical user interface (GUI) as well as other information to the user (e.g., text, objects, and graphics). Display assembly 104 can be assembled and contained within housing 102. Such user input events can be used for any number of purposes, such as resetting smart phone 100, selecting between display screens presented on display assembly 104, and so on. In one embodiment, cover 106 is a protective top layer of transparent or semitransparent material (clear) such that display assembly 104 is visible therethrough. That is, cover 106 serves as a window for display assembly 104 (i.e., the transparent cover overlays the display screen). In one particular embodiment, cover 106 is formed from glass (e.g., cover glass), and more particularly highly polished glass. It should be appreciated, however, that other transparent materials such as clear plastic can be used.

The viewing region can be touch sensitive for receiving one or more touch inputs that help control various aspects of what is being displayed on the display screen. In some cases, the one or more inputs can be simultaneously received (e.g., multi-touch). In these embodiments, a touch sensing layer (not shown) can be located below the cover glass 106. The touch sensing layer can for example be disposed between the cover glass 106 and the display assembly 104. In some cases, the touch sensing layer is applied to display assembly 104 while in other cases the touch sensing layer is applied to the cover glass 106. The touch sensing layer can for example be attached to the inner surface of the cover glass 106 (printed, deposited, laminated or otherwise bonded thereto). The touch sensing layer generally includes a plurality of sensors that are configured to activate as the finger touches the upper surface of the cover glass 106. In the simplest case, an electrical signal is produced each time the finger passes a sensor. The number of signals in a given time frame can indicate location, direction, speed and acceleration of the finger on the touch sensitive portion, i.e., the more signals, the more the user moved his or her finger. In most cases, the signals are monitored by an electronic interface that converts the number, combination and frequency of the signals into location, direction, and speed and acceleration information. This information can then be used by the smart phone 100 to perform the desired control function relative to display assembly 104.

Smart phone 100 can also include one or more switches including power switches, volume control switches, user input devices and the like. Power switch 110 can be configured to turn smart phone 100 on and off, whereas volume switches 112 is configured to modify the volume level produced by the smart phone 100. Smart phone 100 can also include one or more connectors for transferring data and/or power to and from smart phone 100. For example, opening 115 can accommodate audio jack 116 whereas opening 117 can accommodate data/power connector 118. Audio jack 116 allows audio information to be outputted from smart phone 100 by way of a wired connector whereas connector 118 allows data to be transmitted and received to and from a host device such as a general purpose computer (e.g., desktop computer, portable computer). Connector 118 can be used to upload or down load audio, video and other image data as well as operating systems, applications and the like to and from smart phone 100. For example, connector 118 can be used to download songs and play lists, audio books, photos, and the like into the storage mechanism (memory) of smart phone 100. Connector 118 also allows power to be delivered to smart phone 100.

Portion 200 of smart phone 100 can include a number of communication features. For example, portion 200 can include at least first audio port 120 that can be used to output a first portion of audible sound generated by an audible sound generator assembly enclosed within housing 102. The audible sound generator assembly can take many forms. In the described embodiment, however, the audible sound generator assembly includes at least a diaphragm arranged to synchronously vibrate with audio signals provided by a processing unit included in smart phone 100. The audio signals can be provided by the processing unit decoding audio data files retained within smart phone 100. Enclosed within connector assembly 118, second audio port 122 can be used to output a remaining portion of the audible sound generated by the audible sound generator assembly.

The described embodiments can include a proximity sensor that can include at least an infrared light emitter and an infrared light detector. While a user is engaged in a phone call, the infrared light emitter typically emits light that can be transmitted through cover 106 and be emitted from a surface of the cover 106. In this way, when smart phone 100 approaches within a defined distance of a reflecting object (such as an end-users head) a portion of the infrared light emitted from cover 106 is reflected back and detected at least in part by an infrared light detector located within smart phone 100 in proximity to the infrared emitter. Once the amount of reflected infrared light detected by the infrared light detector reaches or exceeds a certain threshold, circuitry associated with the light detector can cause smart phone 100 to take appropriate action. For example, when the end-user's head is within the defined distance, the infrared light reflected from the end-user's head can be detected in such a way to cause display 104 to refrain from displaying any visual content in order to preserve battery power. Furthermore, any input sensitive portions of display 104 can also be disabled in order that any inadvertent touch is not registered as a bone fide user input. Unfortunately there are a number of problems that can cause a proximity sensor to err generally related to the optical dynamics of the interaction between the light emitter and light detector.

Figure 3:
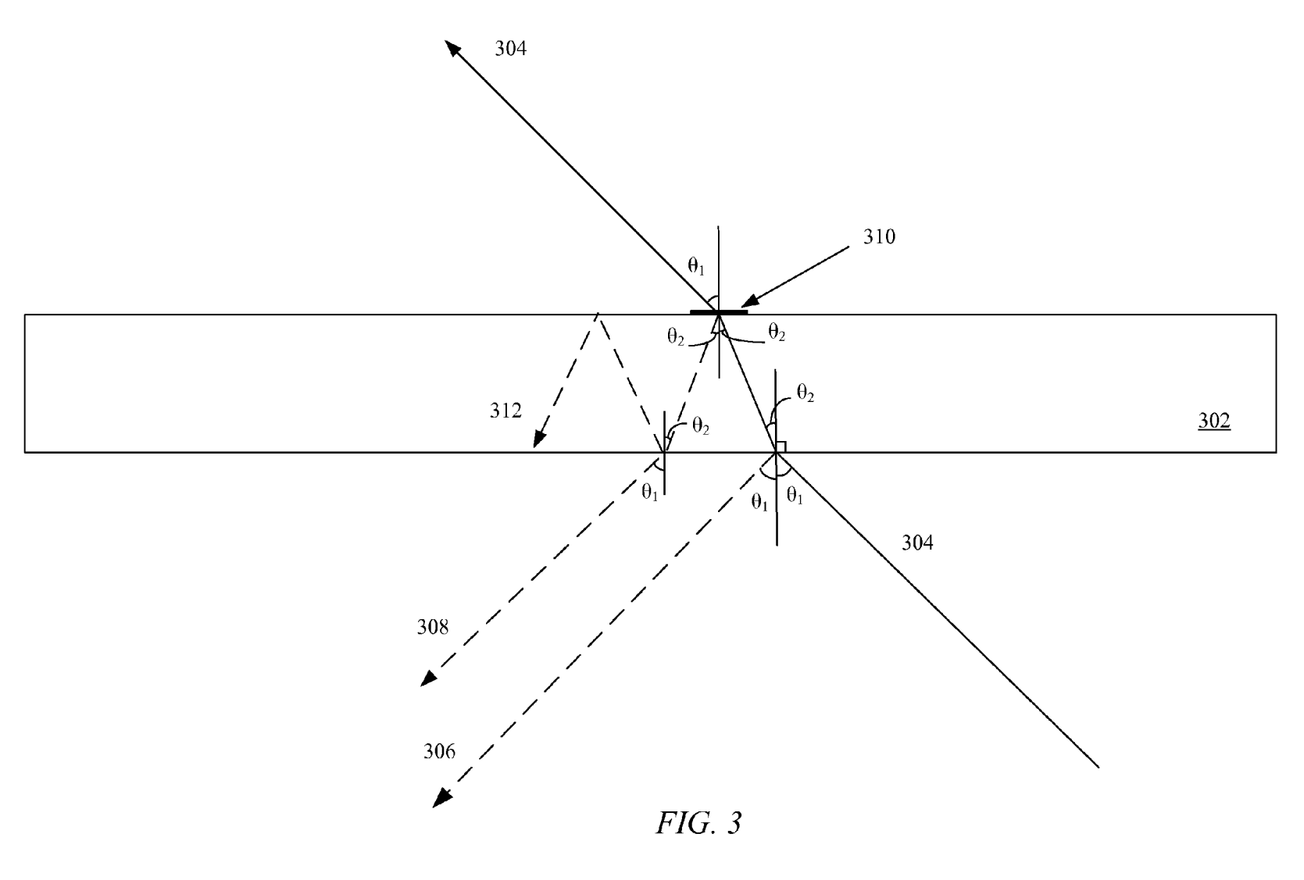
FIG. 3 shows how infrared light can be reflected and refracted as it travels from one medium to another.

FIG. 3 shows light refracting through and reflecting off a glass sheet 302. Refraction is a phenomenon that occurs when light passes from one medium to another. In general when a light beam enters a medium that causes it to change speeds it also changes direction. In this case light beam 304 moves slower through glass sheet 302 than it does through air. A slower speed will cause the angle of incidence $\theta_1$ to decrease to $\theta_2$ as it enters the new medium. In a case like this where light beam 304 is entering from and exiting into the same medium the angle of light as it exits ends up returning to $\theta_1$ as it exits. Unfortunately the energy of the beam does not all pass through the glass; some of the light is reflected instead of refracted. As the angle of incidence $\theta_1$ increases so does the amount of light reflected back off of the surface of glass sheet 302. This means that light beams with high angles of incidence $\theta_1$ will reflect a larger portion of the light. The dashed light beams of FIG. 3 show the potential paths of reflected light. Given a completely flat glass sheet 302, reflected light beam 306 reflects off the surface of glass sheet 302 at the same angle it hits it at. Portions of the light could also be reflected back off the other surface of glass sheet 302 as shown by reflected light beam 308. This is especially likely where an optically active surface associated with, for example, mark 310 or debris is present on the surface of the glass. This can reduce the transparency of glass sheet 302, thereby causing an increased amount of reflection. Finally, reflected light beam 312 shows a third possible light beam path caused by internal reflection at an angle that results in the reflected light being temporarily trapped inside the glass sheet 302.

Figure 4:
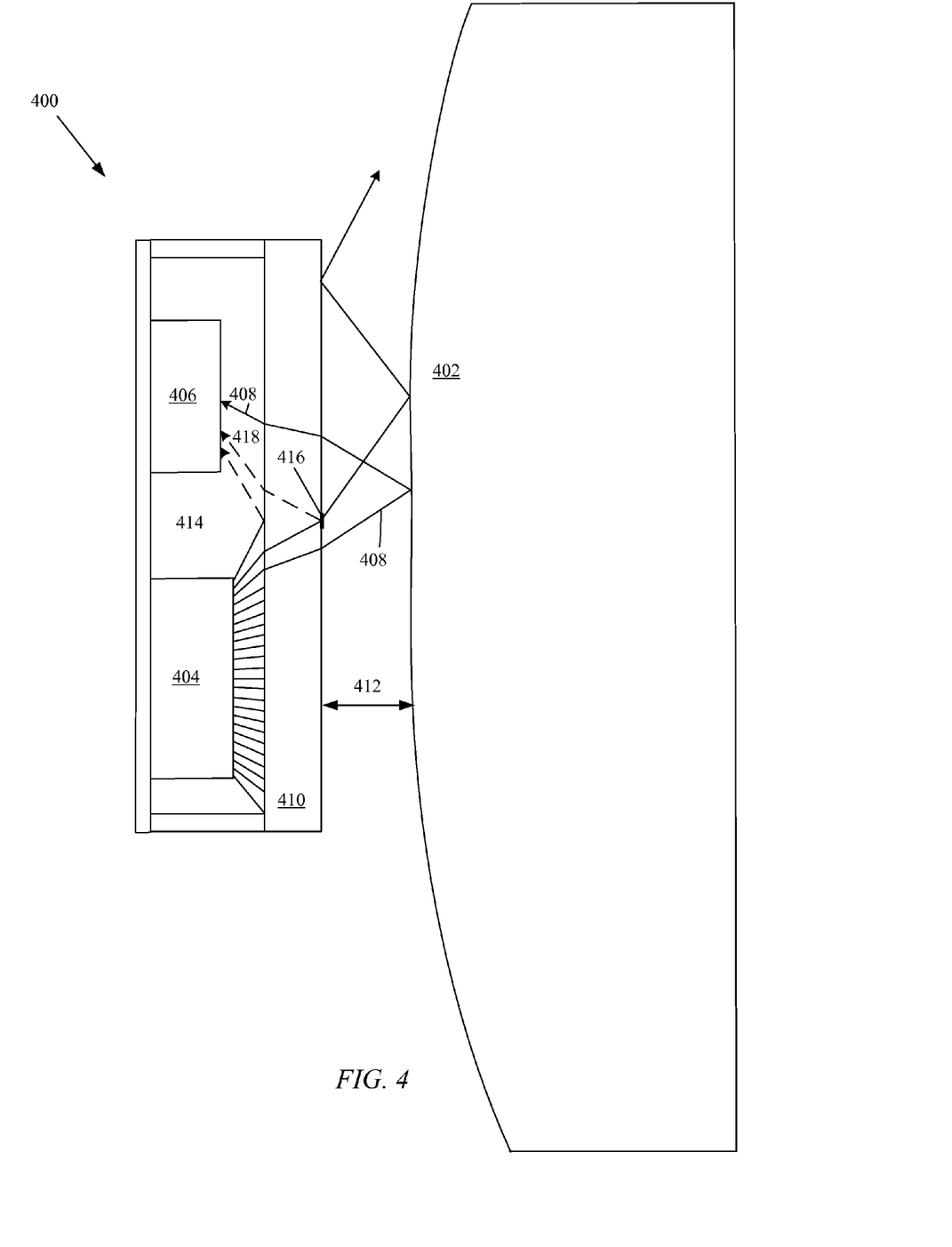
FIG. 4 shows how reflection and refraction of light in a conventional proximity sensor can affect the accuracy of that proximity sensor.

FIG. 4 shows how the refraction and reflection can affect the operation of a conventional proximity sensor 400. In FIG. 4 a top view of the outer edge of an object, such as a user's head 402 is shown. Next to head 402 is a side view of proximity sensor 400. Proximity sensor 400 can be included in, for example, a portable communication device that is generally used in proximity to head 402. Smart phone 100 is a good example of a portable communication device well suited for use of proximity sensor 400. In the described embodiment, proximity sensor 404 can include infrared emitter 404 and photo diode 406. Infrared (IR) emitter 404 can generate light having a frequency spectrum that predominates in the infrared region of the electromagnetic spectrum. Accordingly, IR emitter 404 can generate IR light beam 408 directed at cover glass 410. Portions of IR light beam 408 can be reflected from an interior surface of cover glass 410 while another portion can be transmitted and refracted through cover glass 410 a portion of which is ultimately reflected off of end user's head 402. A portion of IR light beam 408 that impinges end user head 402 can be reflected back into and refracting through cover glass 410 some of which is then detected by photo diode 406. It should be noted that cover glass 410 could be made of any optically transmissive protective material (i.e. plastic or glass) that allows infrared light to pass through it, but for the sake of this example glass will be used without any loss of generality. Proximity sensor 400 will generally be designed in such a way that when end user's head 402 is located at an activation point that is at or within activation distance 412 from cover glass 410 the amount of infrared light detected by photo diode 406 will equal or exceed a predetermined threshold. Once the threshold has been reached, or exceeded, proximity sensor 400 sends a proximity signal to a processor that can execute instructions that can cause smart phone 100 to take appropriate action. For example, upon the detection of end user's head within activation distance 412, proximity sensor 400 can cause display 104 of smart phone 100 to be secured. By secured it is meant that display 104 is placed into an operating state consistent with smart phone use. Such an operating state can involve, for example, disabling display functions, user touch event functions, and so on.

Unfortunately as can be seen by the other possible paths of light illustrated in FIG. 3, not all received infrared light beams are reflected off the user. In some cases as shown by light beam 414, light that arrives at the cover glass 410 at a high angle of incidence tends to reflect off the surface of the cover glass 410. When enough light is internally reflected in this way, photo diode 406 can detect sufficient IR energy to cause photo diode 406 to erroneously send the proximity signal to the processor, thereby causing a false trigger of the display screen lock. This can be quite irritating for a user that is trying to use some other feature of the phone while carrying on a conversation. This type of error is known as cross talk. A second problem that can occur is when a smudge 416 or others obscuring material covers a portion of the optical path taken by the infrared light. For example, smudge 416 can reduce the transparency of the cover glass 410 causing light beam 418 to reflect back to be detected by photo diode 406 as if contacting user's head 402. This can also contribute towards a false trigger in which the phone reacts as if it is against the user's face when, in fact, it is not. In situations where smudge 416 is created during the call, a user wishing to perform an action on the phone, such as entering a user input at a touch portion of the display assembly, might not be able to since after pulling the phone away from user's head 402, photo diode 406 continues to receive enough infrared light from the smudge reflection that the processor is instructed to maintain the display in a secured state. A third problem that can occur is when the phone does not get enough infrared light to activate photo diode 406. This could also occur when a user with long dark hair is using the phone. When the phone is placed against a user's hair instead of directly against user's head 402, the dark hair does not reflect the infrared light as strongly; consequently the signature received by photo diode 406 is not strong enough to activate the sensor. It should be readily apparent that proximity sensor designers must maintain a careful balance of parameters in order to have an effective reliable sensor.

Figure 5:
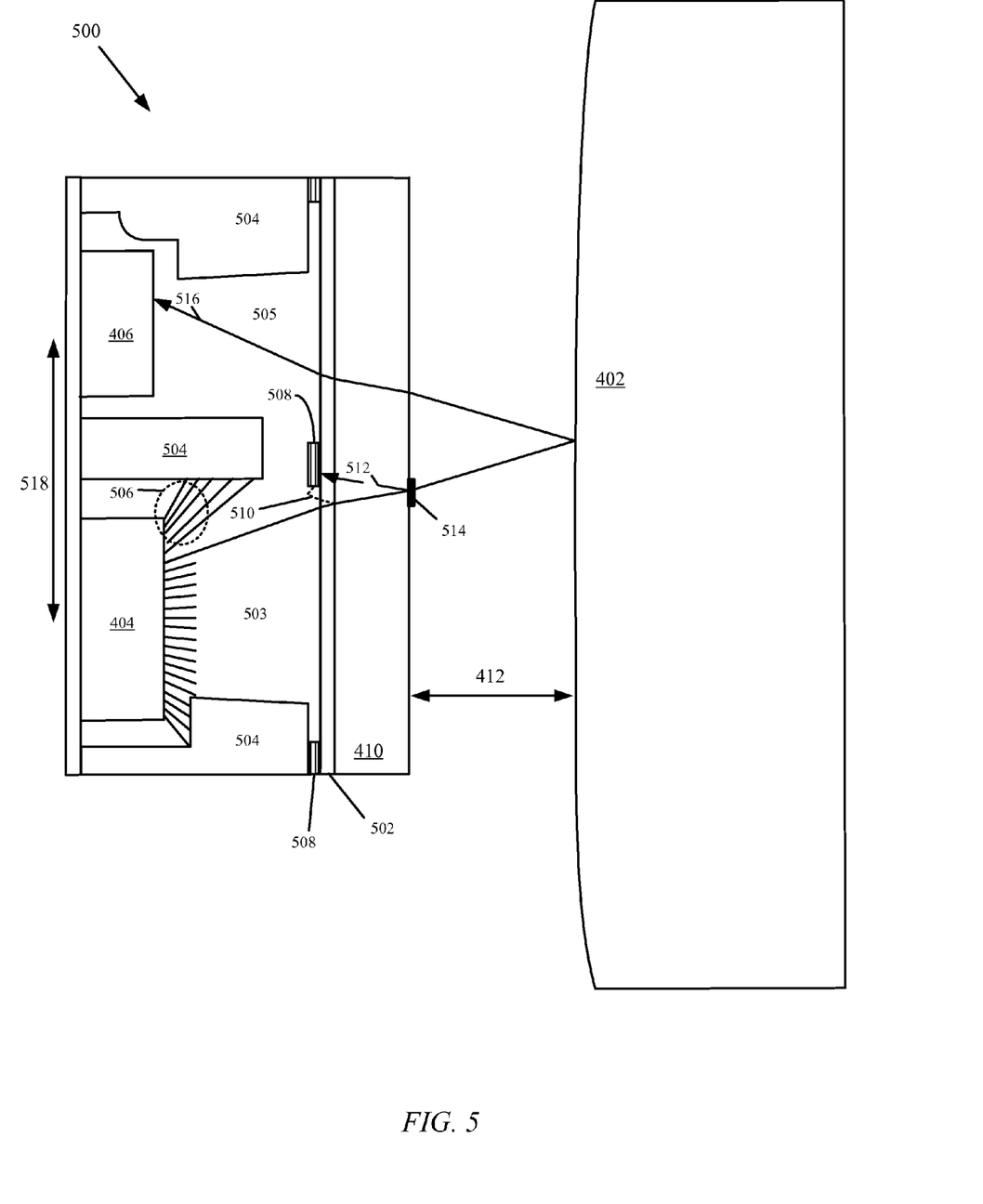
FIG. 5 shows a proximity sensor in accordance with the described embodiments.

FIG. 5 shows a side view of proximity sensor 500 in accordance with the described embodiments. In this embodiment IR transparent ink layer 502 has been added to the inside of cover glass 410. IR transparent ink layer 502 filters out any other frequencies of light from being emitted from aperture 503 in proximity to emitter 404, or from being admitted into the aperture 505 in proximity to photo diode 406. Apertures 504 act as collimators to reduce the occurrence of reflection by causing emitted light to exit the cellular phone at a low angle of incidence, resulting in a substantial reduction in reflection, and any cross talk problems. For example, aperture 504 blocks or redirects the infrared light beams 506 that heretofore caused cross talk as shown in FIG. 4. Moreover, an optical structure applied to the inner surface of IR transparent ink layer 502 designed to reduce cross talk. When infrared light does manage to get reflected off either glass cover 410 or IR transparent ink layer 502, the optical structure 508 can absorb a substantial amount of the reflected infrared energy, as illustrated in FIG. 5 by reflected infrared light beam 510. The shape and size of the optical structure 508 will be further detailed and described in FIG. 6. When infrared light beam 512 is reflected off cover glass 410 by smudge 514, the optical structure 508 also acts to absorb and diffuse the reflected infrared energy, thereby preventing being detected by photo diode 406 resulting in a false trigger action. While apertures 504 and the optical structure 508 help to greatly reduce the effects of cross talk and problems related to smudges on protective layer, IR light emitter 404 and photo diode 406 must still be arranged in relation to each other such that infrared light beams (such as light beam 516) can effectively travel the optical path defined in part by emitter 404, head 402, and photo diode 406. By selecting distance 518 in relation to the size and shape of apertures 504, the optical path between IR light emitter 404 and photo diode 406 can be arranged to efficiently transport IR energy.

Figure 6:
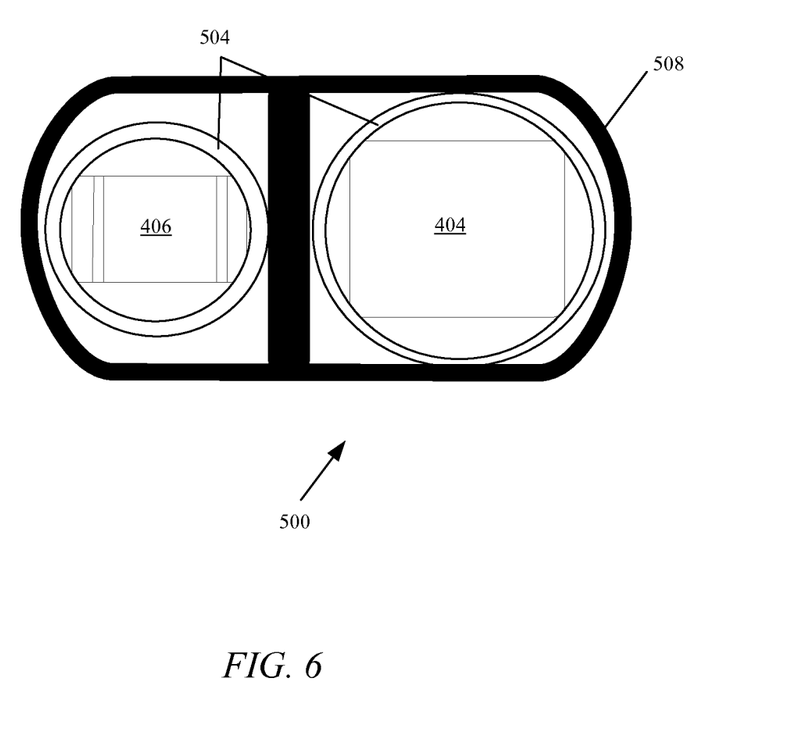
FIG. 6 shows a top view of a proximity sensor mounted on a piece of sensor flex.

FIG. 6 shows a top view of proximity sensor 500 attached to a portion of sensor flex 602. The optical structure 508 is also illustrated, and encircles both emitter 404 and photo diode 406. Configured in this way the optical structure 508 can effectively absorb infrared light at the edges of each aperture 504. In this illustration it can also be seen how apertures 504 encircle both emitter 404 and the photo diode 406. The optical structure 508 can be generally sized to fit completely underneath the IR transparent ink layer 502 (not shown) such that the optical structure 508 is not apparent to the end user.

Figure 7:
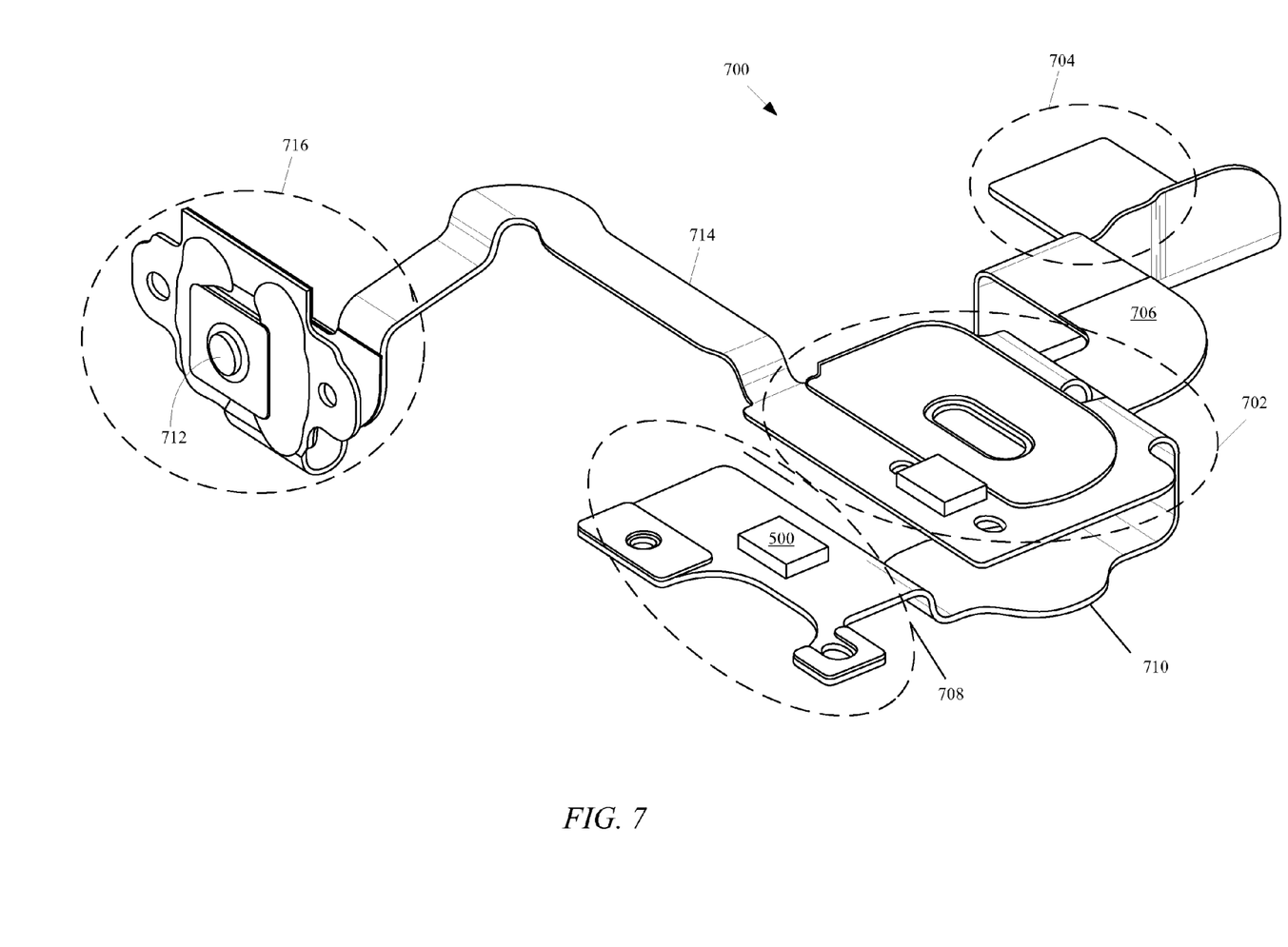
FIG. 7 shows a perspective view detailing how a proximity sensor can be attached to other components in a cellular phone in accordance with the described embodiments.

FIG. 7 is a perspective view showing an embodiment of proximity sensor flexible connector 700 (or more simply referred to as a sensor flex) in accordance with the described embodiments. Proximity sensor flexible connector 700 can be made from a conductive material or a non-conductive material depending on the design and the needs of the device and components connected. In one embodiment, the body of proximity sensor flexible connector 700 is generally a unitary construction manufactured from a resilient material. One of ordinary skill in the art will readily appreciate that there are a variety of ways to manufacture proximity sensor flexible connector 700 in accordance with aspects of the present invention. Sensor flex 700 can also include at least one fastening means. The fastening means can be configured for maintaining a secure connection between the contacts of a printed circuit board or individual component and the contacts provided on the associated flex connector. The fastening means can be located on the first and second sides of the body of the flex connector or directly on a fixation portion, also referred to as a connector. The connector can be of any shape, for example, a hole, a notch, a bump, a hook, a male or a female snap locking member.

Sensor flex 700 can be mounted onto a printed circuit board or directly to an electrical component in many different ways. For example, one or more contact patterns can be formed that can be any desired form and include multiple patterns. In those situations where spacing between components is limited (due to the inclusion of sensor flex 700 in a small form factor device, such as a smart phone), sensor flex 700, or at least portions thereof, can be arranged into a compact folded configuration. In this way, individual electrical components can be placed in close proximity to each other thereby greatly conserving an amount of space required for assembly. In any case and regardless of the configuration of sensor flex 700, each contact that is electrically isolated from another contact in the contact pattern and each corresponds to an independent signal line that can receive and/or transmit signals to and/or from one or more circuits populated on a printed circuit board and/or otherwise coupled to one of the contacts associated with the contact pattern.

Sensor flex 700 can be secured to a printed circuit board any means know in the art or later developed technology. For example, a pick and place machine can be used to securely place sensor flex 700 in the proper position on a printed circuit board 106 that form an electrical connection from the associated printed circuit board to the associated flex connector. When a soldering agent is used, it may be desirable to heat (or otherwise bake) at least a portion of the printed circuit board (e.g., the securing agent) in order to wet the soldering agent for affixing the connector to the printed circuit board. However, establishing a desired electrical connection pattern can require that at least portions of sensor flex 700 be arranged to form a compact folded configuration resulting in potentially damaging stress applied to the traces embedded within sensor flex 700. Therefore, as described below, part of the assembly and electrical connection operation can include the application of a resilient material to at least the folded configuration that can reduce potentially damaging forces applied to the folded portion of sensor flex 700.

Generally speaking, sensor flex 700 can be used to both mechanically and electrically connect proximity sensor circuit 500 to other electrical and mechanical components. For example, as shown, sensor flex 700 can be used to connect proximity sensor 500 both physically and electrically with other components in the smart phone 100. For example, receiver port 702 can be used to receive audio signals that can then be processed by a processor unit included in a main logic board, or MLB. In the described embodiment, receiver port 702 can be electrically connected to the MLB by way of MLB connector 704. As shown, serpentine flex portion 706 can be used to form an electrical connection between receiver port 702 and MLB connector 704. However, in order to maximize component density (due to the small size of smart phone 100), sensor flex 700 can be used to efficiently connect multiple components together, each then being electrically connected to MLB connector 704 by way of a number of electrical traces incorporated into flex connector 700. However, in order to maintain the large number of separate electrical traces required to handle all necessary signal traffic between the various interconnected components and yet maintain a small footprint, sensor flex 700 can be both thin and flexible. For example, proximity sensor flex 708 can have three layers of circuits layered on top of each other. In this way, portions of sensor flex 700 can be wrapped around and/or under other components thereby creating a three dimensional connection pattern as opposed to two dimensional, i.e., flat, connection pattern typical of conventional flex connectors.

Therefore, in order to accommodate the three dimensional folding aspect of sensor flex 700, foldable portion 710 of sensor flex 700 can be wrapped under receiver port 702, for example. In this way, proximity sensor circuit 500 can be connected to MLB connector 704 and yet occupy a very small footprint vis-a-vis receiver port 702. For example, by wrapping foldable portion 710 beneath receiver port 702, proximity sensor circuit 500 can be placed close to receiver port 702 thereby reducing an overall footprint. In this way, the overall area taken up by the combination receiver port 702 and proximity sensor circuit 500 can be substantially reduced over those designs that rely upon a flat (i.e., a two dimensional, flexible connector). Moreover, the use of foldable portion 710 allows for proximity sensor circuit 500 to be mounted in a recessed fashion with regards to receiver port 702. In order to accommodate a number of components, sensor flex 700 can be formed in such a way as to include a number of branching connectors which in the embodiment shown in FIG. 7 radiate from receiver port 702. For example, in addition to serpentine flex portion 706 discussed above, hold button 712 can be connected to MLB connector 704 using hold button flex portion 716.

Figure 8:
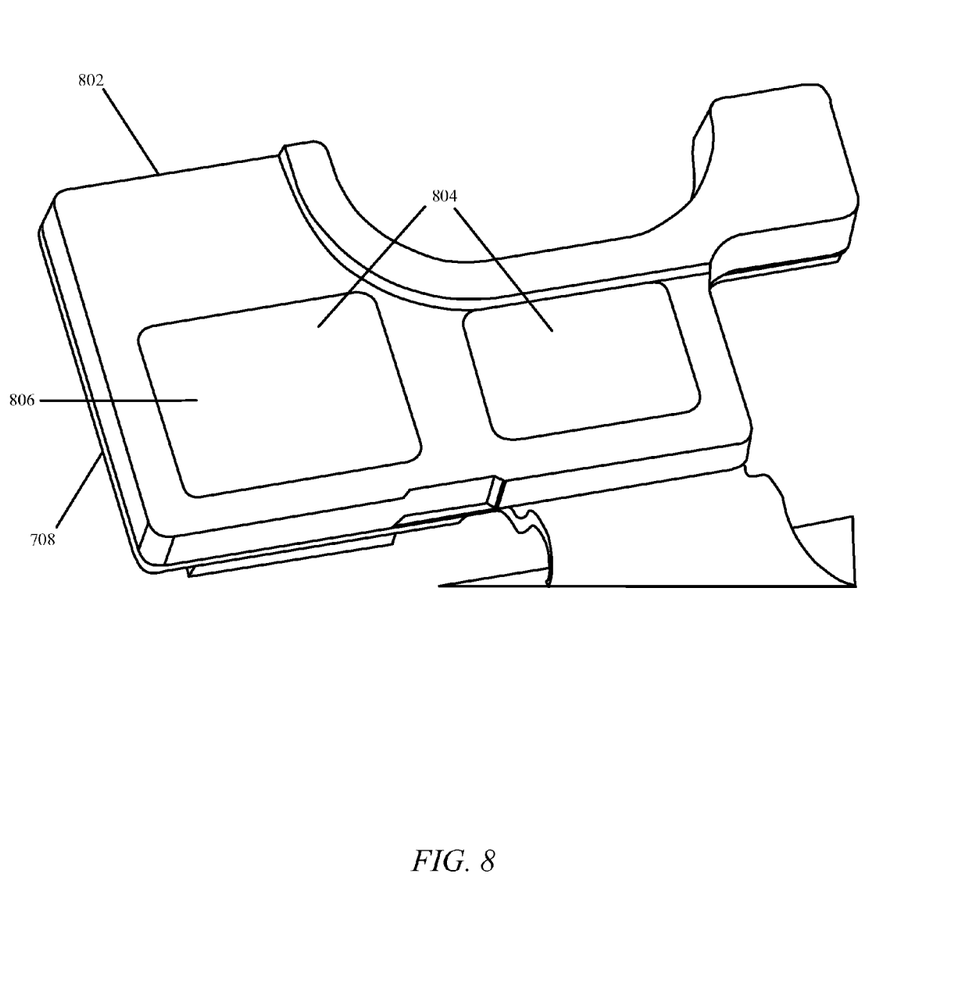
FIG. 8 shows an embodiment having a backer plate and conformal coating added to the back side of a proximity sensor's sensor for reducing trace damage during assembly.

FIG. 8 shows the back side of sensor flexes 708 for proximity sensor 500. When proximity sensor 500 is attached to the substrate to align with apertures 504 (not shown), a force of a magnitude that substantially increases a risk of damaging the traces. As this damage would generally occur at a final assembly step, it would be highly advantageous to substantially reduce, or even eliminate, this possibility. In particular, as discussed above, in the described embodiment, there are 3 layers of traces embedded in sensor flex 708 and therefor, the force applied by the assembly process (such as when proximity sensor 712 is wrapped around and under receiver port 702) can create a moment foldable sensor flex portion 708 when seating proximity sensor 500 that can result in broken traces that cannot be visually detected. The damaged traces can only be detected at post assembly quality check. However, in some situations, the damaged traces may not evidence themselves until sometime later only after a particular amount of operating time has elapsed. Therefore, it is important for both assembly yield and reliability issues that the incidence of broken or damaged traces be reduced to a minimum.

Accordingly, one approach to addressing this problem relies upon the addition of backer plate 802 being overlaid on the back side of sensor flex 708 as illustrated in FIG. 8. Backer plate 802 can be made from any substantially rigid material. In this exemplary embodiment it can be made of plastic. However, in order to further reduce the likelihood of damaging the traces, additional support can be provided. For example, sensor flex areas 804 can be susceptible to bending moments since supporting components such as op-amps prevent backer plate 802 from providing the requisite support. Therefore, in order to provide the requisite support and reduce the overall probability of damaging the traces, conformal coating of resilient material 806 can be added to unsupported areas 804 of the sensor flex. The conformal coating can take the form any material that can flow into and around the area near backer plate 802. In this way, conformal coating 806 integrates with backer plate 802 forming a solid structure that improves the overall structural rigidity of sensor flex areas 804 having the result that sensor flex areas 804 are protected from damaging bending moments during assembly.

Figure 9:
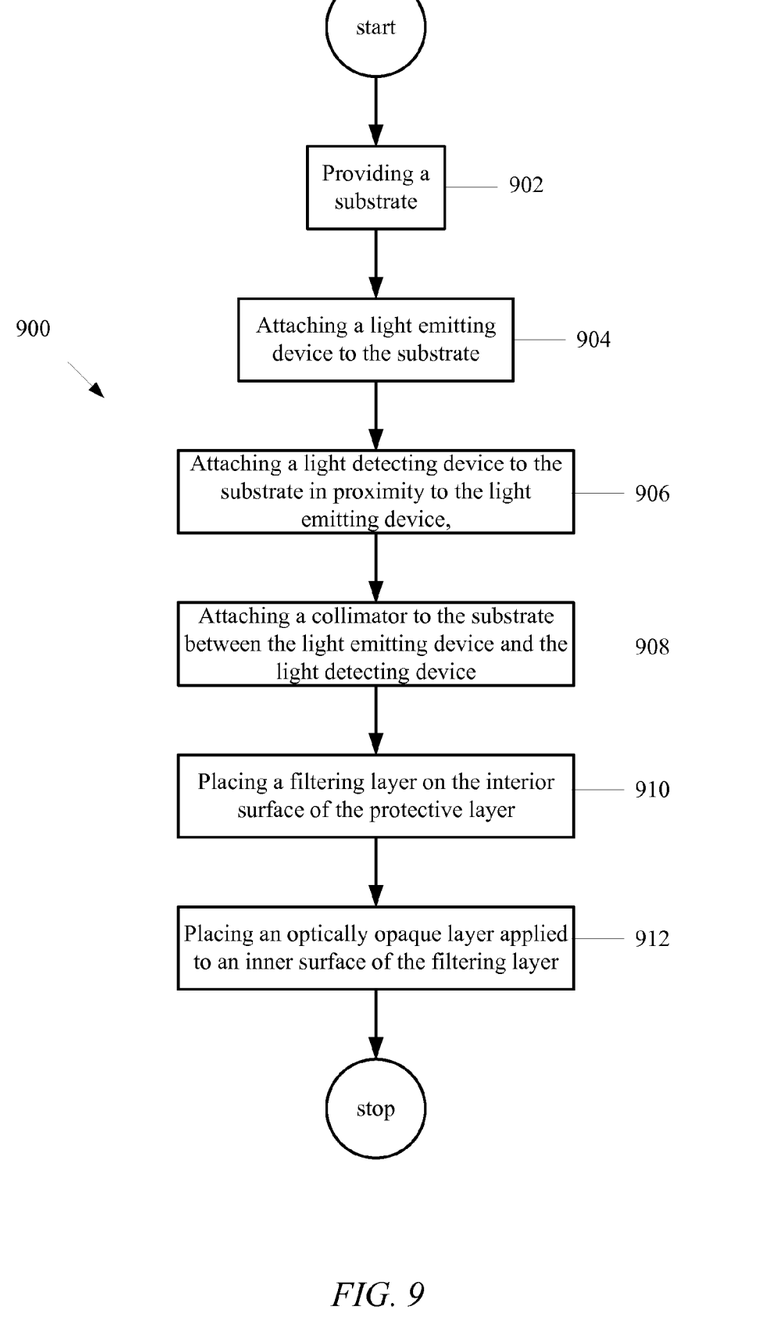
FIG. 9 shows a flowchart detailing process in accordance with the described embodiments.

FIG. 9 shows a flowchart detailing process 900 in accordance with the described embodiments. Process 900 can be carried out as a manufacturing process. In one embodiment, process 900 can be carried out by a processor executing instructions stored on a non-transient computer readable medium. The processor can direct assembly operations of a proximity sensor. The proximity sensor can be used to detect the presence of an object within a first distance of an exterior surface of the protective layer. In a particular embodiment, process 900 can carried out by performing at least the following operations, providing a substrate at 902, attaching a light emitting device to the substrate, the light emitting device arranged to emit light at a primary frequency in a direction outward and away from the portable electronic device at 904; attaching a light detecting device to the substrate in proximity to the light emitting device, the light detecting device arranged to detect light at least at the primary frequency at 906; attaching a collimator to the substrate between the light emitting device and the light detecting device, the collimator causing a substantial portion of the light emitted by the light emitting device to impinge an interior surface of the protective layer at a low angle of incidence at 908; placing a filtering layer on the interior surface of the protective layer, the filtering layer arranged to filter out frequencies of light other than the primary frequency thereby substantially reducing the likelihood of the light detecting device from detecting light other than that of the primary frequency at 910; and placing an uniform transparent structure applied to an inner surface of the filtering layer, the uniform transparent structure having a size and shape in accordance with the proximity sensor, the uniform transparent structure arranged to absorb substantially all light incident thereon thereby reducing an amount of light detected by light detecting device not associated with light reflected from the object at 912.

Figure 10:
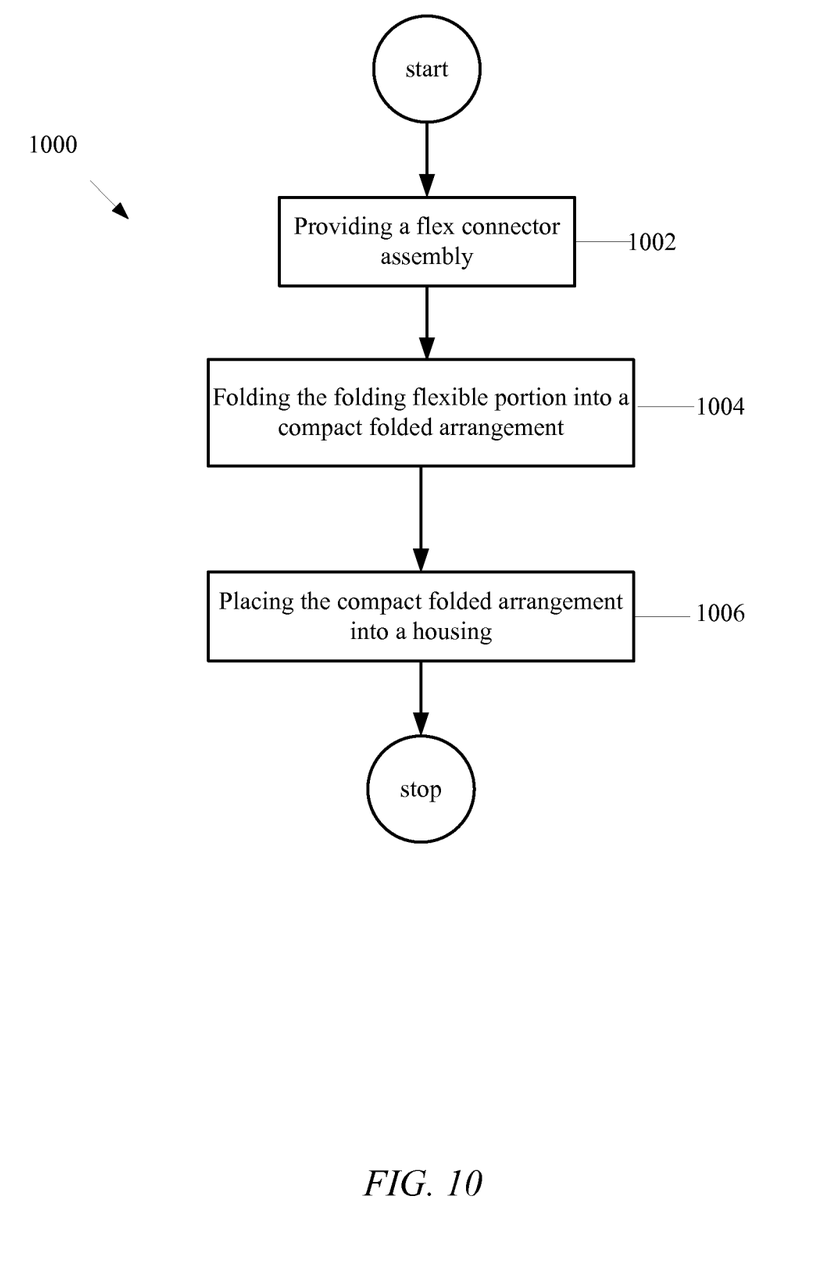
FIG. 10 shows a flowchart detailing process for assembling a small form factor electronic device in accordance with the described embodiments.

FIG. 10 shows a flowchart detailing process 1000 for assembling a small form factor electronic device in accordance with the described embodiments. Process 1000 can be carried out by providing a flexible connector assembly at 1002, folding a flexible portion of the flexible connector assembly into a folded arrangement at 1004, and at 1006 placing the compact folded arrangement in a housing of the small form factor electronic device. In one embodiment, the compact folded arrangement can cause at least two components to be space in close proximity to each other. For example, one component can take the form of an audio device for providing audible signals and another component can take the form of a proximity sensor used to detect a presence of an object within a pre-determined distance to the small form factor electronic device.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A flex connector assembly for connecting electrical components in a small form factor communication device, comprising:
    a main body portion, comprising:
    a receiver port having a first connection area arranged to receive and electrically connect to a first component, which comprises an audio circuit;
    a sensor flex portion having a second connection area arranged to receive and electrically connect to a proximity sensor, the proximity sensor configured to detect an object within a pre-determined distance of the proximity sensor and provide a signal that indicates that the object is within the pre-determined distance; and
    a first folding flexible portion connecting the receiver port and the sensor flex portion, wherein the secured first component and the secured a proximity sensor are brought in close proximity to each other by folding the folding flexible portion into a compact folded arrangement;
    a main logic board connector having a third connection area; and
    a second folding flexible portion coupling the main logic board connector to the main body portion.

2. The flex connector assembly as recited in claim 1, further comprising:
    a flex portion having a fourth connection area; and
    a third folding flexible portion connecting the flex portion to the main body portion independent of the main logic board connector.

3. The flex connector assembly as recited in claim 1, wherein the compact folded arrangement of the flex connector assembly provides that the audio circuit and the proximity sensor are placed in close proximity to each other and that the proximity sensor is recessed with respect to the audio circuit.

4. The flex connector assembly as recited in claim 3, wherein the proximity sensor further comprises:
    a light emitting portion; and
    a light detecting portion in proximity to the light emitting portion.

5. The flex connector assembly as recited in claim 4, wherein the light emitting portion emits infrared light.

6. The flex connector assembly as recited in claim 5, further comprising an aperture disposed between the light emitting portion and the light detecting portion, wherein the aperture acts as a collimator and prevents light leaving the light emitting portion at a low angle of incidence from impacting the light detecting portion.

7. The flex connector assembly as recited in claim 6, wherein the light detecting portion is a photo diode.

8. The flex connector assembly as recited in claim 7, wherein the main body portion is made from a conductive material.

9. The flex connector assembly as recited in claim 8, wherein the sensor flex portion includes two or more layers of circuits layered together, wherein the two or more layers of circuits allow a three dimensional connection pattern to be established.

10. The flex connector assembly as recited in claim 9, wherein the main logic board connector includes means for mechanically and electrically coupling the main logic board connector to a printed circuit board.

11. The flex connector assembly as recited in claim 10, wherein the main logic board connector includes a snap locking member configured to engage with the printed circuit board.

12. The flex connector assembly of claim 1 wherein the sensor flex portion comprises a resilient material coated on a surface.

13. The flex connector assembly of claim 1 wherein the sensor flex portion is wrapped under the receiver port.

14. The flex connector assembly of claim 1, wherein the sensor flex portion comprises a backer plate.

15. The flex connector of claim 1, wherein the sensor flex portion is electrically and mechanically coupled to the proximity sensor.

16. A small form factor communication device, comprising:
- a main logic board having a processor unit to process received audio signals;
- a proximity sensor to detect a user distance to the device; and
- a flex connector assembly, comprising:
- a main body portion, comprising:
- a receiver port having a first connection area arranged to receive and electrically connect to a first component, which comprises an audio circuit;
- a sensor flex portion having a second connection area arranged to receive and electrically connect to a proximity sensor, the proximity sensor configured to detect an object within a pre-determined distance of the proximity sensor and provide a signal that indicates that the object is within the pre-determined distance;
- a first folding flexible portion connecting the receiver port and the sensor flex portion, wherein the secured first component and the secured proximity sensor are brought in close proximity to each other by folding the folding flexible portion into a compact folded arrangement;
- a main logic board connector having a third connection area; and
- a second folding flexible portion coupling the main logic board connector to the main body portion.

17. The communication device of claim 16 further comprising a display, and wherein the proximity sensor is configured to secure the display into an operating state when the user distance is smaller than an activation distance.

18. The communication device of claim 16, wherein the proximity sensor comprises a light emitter and a photo diode, the photo diode configured to measure a light beam reflected from a user.

19. The communication device of claim 18, wherein the proximity sensor further comprises an aperture to reduce cross talk between the light emitter and the photo diode.

* * * * *

UNITED STATES PATENT AND TRADEMARK OFFICE
CERTIFICATE OF CORRECTION

PATENT NO. : 8,611,095 B2
APPLICATION NO. : 13/239821
DATED : December 17, 2013
INVENTOR(S) : Kelvin Kwong et al.

It is certified that error appears in the above-identified patent and that said Letters Patent is hereby corrected as shown below:

In the Claims:

Column 12, claim 1, line 26, currently reads: "component and the secured a proximity sensor are"

Column 12, claim 1, line 26, should read: "component and the secured proximity sensor are"

Signed and Sealed this
Eleventh Day of March, 2014

Michelle K. Lee
*Deputy Director of the United States Patent and Trademark Office*